United States Patent [19]
Eatwell et al.

[11] Patent Number: 5,481,615
[45] Date of Patent: Jan. 2, 1996

[54] AUDIO REPRODUCTION SYSTEM

[75] Inventors: Graham P. Eatwell, Cambridge; Andrew Langley, Herts, both of United Kingdom

[73] Assignee: Noise Cancellation Technologies, Inc., Linthicum, Md.

[21] Appl. No.: 41,382

[22] Filed: Apr. 1, 1993

[51] Int. Cl.$^6$ .............................. G10K 11/16; H03G 5/00
[52] U.S. Cl. .................. 381/71; 381/72; 381/74; 381/103
[58] Field of Search ................... 381/71, 26, 74, 381/103, 72

[56] References Cited

U.S. PATENT DOCUMENTS

| | | |
|---|---|---|
| 4,153,815 | 5/1979 | Chaplin . |
| 4,473,906 | 9/1984 | Warnaka . |
| 4,610,024 | 9/1986 | Schulhof ................................ 381/103 |
| 4,631,749 | 12/1986 | Rapaich .................................. 381/103 |
| 4,654,871 | 3/1987 | Chaplin . |
| 4,739,513 | 4/1988 | Kunungi et al. .......................... 381/26 |
| 4,977,600 | 11/1990 | Ziegler . |
| 5,105,377 | 4/1992 | Ziegler . |
| 5,182,774 | 1/1993 | Bourk ...................................... 381/74 |

FOREIGN PATENT DOCUMENTS

| | | |
|---|---|---|
| 611674 | 1/1961 | Canada . |
| WO91/13429 | 9/1991 | WIPO . |
| WO92/08223 | 5/1992 | WIPO . |

OTHER PUBLICATIONS

Windrow, B. and Stearns, S D, *Adaptive Signal Processing*, Prentice Hall. 1985, pp. 8, 9, 99.

K. J. Astrom and B. Wittenmark, *Adaptive Control*, (1989), book as a whole.

A. Lapedes and R. Farber, "How Neural Nets Work," IEEE Denver Conference on Neural Networks (1987).

S. J. Elliot, "A Multiple Error LMS Algorithm and Its Application to the Active Control of Sound and Vibration," IEEE Transactions on Acoustics, Speech, and Signal Processing, vol. ASSP-35, No. 10 (Oct. 1987).

Olsen, H. F. and May, E. G. Journal of the Acoustical Society of America. 25, 1130–1136. (1953).

Miyoshi, M. and Kaneda, Y. "Speech and Signal Processing". IEEE Transactions on Acoustics. ASSP-36. 145–152. 1988.

Astrom, K J. and Wittenmark, B., *Adaptive Control. Addison Wesley. 1989.*

Elliot, S J., IEEE Transactions on Acoustics, Speech, and Signal Processing. ASSP-35, 1423–1434. 1985.

*Primary Examiner*—Forester W. Isen
*Attorney, Agent, or Firm*—James W. Hiney

[57] ABSTRACT

An improved audio system designed to maintain a desired sound at the ear of a listener by using an equalization filter (2). The equalization filter (2) is continuously adjusted in response to the signal (9) from a sensor (8) which monitors the sound close to the listener's ear. The audio system can be combined with an active noise control system (3) to reduce interference from external noise.

20 Claims, 7 Drawing Sheets

AUDIO REPRODUCTION SYSTEM

INTRODUCTION

The accurate reproduction of recorded or broadcast sound requires an audio system which has a neutral or flat response. The relative amplitudes (and phases) of the desired signal at different frequencies should ideally remain unchanged as they pass through the audio system to the ear. This is usually impossible to achieve, even with perfect loudspeakers, because of the non-uniform and variable acoustic response of the space surrounding the loudspeakers. The most accurate reproduction is usually achieved using headsets, since then only the local acoustic response is involved. The fidelity of a stereo headset is determined by the acoustic response of the headset while it is being worn. This in turn depends upon the characteristics of the loudspeaker driver, the enclosure behind the loudspeaker and the enclosure formed by the headset and the head of the wearer. This last enclosure is variable and so a perfect frequency response cannot be guaranteed. The effect of this variability can be minimized by increasing the acoustic impedance of the rest of the system, but this will compromise the performance.

The quality of the reproduced music is also reduced because of external noise. For closed-back headsets the components of the noise at higher frequencies are reduced by the ear cup of the headset, but the low frequency components prevail. Open-backed headsets, which are popular because of their light weight and improved comfort, provide little or no protection against external noise.

The invention described here provides an adaptive control system for improving the fidelity of an audio system, such as a headset or telephone for example, by improving its frequency response and reducing the level of external noise heard by the listener.

BACKGROUND

The idea of using controlled sound to cancel unwanted noise is well known. The idea of a fixed feedback control system for canceling noise is described by H. F. Olsen and E. G. May, *Journal of the Acoustical Society of America*, (1953), 25, 1130–1136. This idea has been implemented using analog circuits and has been applied to ear defenders. A more modern approach is to use an adaptive digital feedback control system, which solves the potential problem of instability. An example of this control system, which was introduced in U.S. Pat. No. 5,105,377 (Ziegler), hereby incorporated by reference herein, is shown in FIG. 1.

The idea of combining an adaptive noise canceling headset with a communications system is disclosed in U.S. Pa. No. 4,654,871 (Chaplin). An adaptive noise canceling headset adjusts its characteristics in response to the residual sound at a microphone close to the ear. When a communication signal is added, the communication signal at the microphone can be predicted and subtracted from the residual signal. This prevents cancellation of the desired signal. Such a control system is shown in FIG. 2. One aspect of an adaptive headset is that knowledge of the system response is required in order to determine how to adjust the controller characteristics. This often requires the generation of a low level test signal which is undesirable.

There have also been many attempts to improve the response of an audio system by using inverse filtering techniques. Identification of inverse filters is described in B. Widrow and S. D. Stearns, 'Adaptive Signal Processing', Prentice Hall, (1985). The method attempts to find a delayed inverse filter, such that a signal passed through a system (or plant) and then through the inverse filter corresponds to a delayed version of the original signal This has been applied to electronic systems and to audio reproduction in rooms. However, many rooms have a reverberant response which cannot be inverted by standard techniques. More complex techniques such as that described in M. Miyoshi and Y. Kaneda, *Institute of Electrical and Electronics Engineers Transactions on Acoustics, Speech and Signal Processing*, ASSP-36, 145–152, (1988), use multiple channels of control to attempt to avoid this problem. These methods seek to equalize the response of the room by using microphones at fixed locations. The microphones are often only used for an initial calibration of the room The equalization is only effective over a limited region and is limited to low frequencies, so there is no guarantee that the sound at the listener's ear will be significantly improved. The approach is ineffective at high frequencies.

OBJECTS OF THE INVENTION

One object of this invention is to provide a method for automatically adjusting the response of an audio reproduction system so that the listener hears a more accurate reproduction of a desired signal.

A further object of this invention is to provide a self-equalizing audio system for signal reproduction in which the equalization is achieved by an adaptive equalization filter (at least one per channel).

A further object of this invention is to provide a self-equalizing audio system which also reduces external noise by use of active noise control.

These and other objects will become apparent when reference is had to the accompanying drawings in which:

FIG. 1 is a diagrammatic view of a Feedback Control System (Background Art),

FIG. 2 is a diagrammatic view of a Noise canceling headset with Communications (Background Art), FIG. 3 is a diagrammatic view of a Self Equalizing Audio system, FIG. 4 is a diagrammatic view of a Self Equalizing Audio system with Active Noise Control, FIG. 5 is a diagrammatic view of a Self Equalizing Audio system with Active Noise Control, FIG. 6 is a diagrammatic view of a Self Equalizing Headset with Feedforward Noise Control, and FIG. 7 is a diagrammatic view of a Self Equalizing Headset with Feedback Noise Control.

SUMMARY

Each channel of the system comprises an input for receiving a desired input signal, a sensor for providing sensor signals representative of the sound at the ear and an equalization filter which is responsive to the desired signal and produces a signal to drive the acoustic actuator. The equalization filter is adapted in response to a signal derived from the sensor signal and the desired signal so as to maintain the desired sensor signal in a preferred relationship to the desired input signal.

One aspect of this invention is that a sensor is positioned close to the ear or the listener so that the equalization may be done continuously. Because the equalization is achieved in a small region close the listener's ear the listener obtains the full benefit from the equalization and the equalization can be effective over a much wider frequency range. This is in contrast to previous methods which seek to equalize an electrical system or a whole room.

A further aspect of this invention is that the actuator is positioned close to the ear so that physical system is invertible (apart from a delay).

A stereo headset incorporating the invention might use one channel per ear.

A telephone incorporating the invention might use a single channel for the ear piece.

The system can be combined with a fixed or adaptive active noise control system so as to reduce the effects of external sounds.

The active noise control system may be adaptive, in which case the sensor signal can also be used to adjust the active noise control system.

The input to the active noise control system can be derived from the sensor signal, as in U.S. Pat. No. 5,105,377 (Ziegler).

Alternatively, the input can be provided by additional sensors which are responsive to the external noise, as in PCT/GB91/00265 (Eatwell et al) which includes a description of a headset using adaptive feedforward control.

Alternatively, the input can be provided by additional sensors which are responsive to some characteristic of the source of the noise (such as the frequency or phase of a periodic noise source as in U.S. Pat. No. 4,153,815 (Chaplin)).

DETAILED DESCRIPTION OF THE INVENTION

The invention provides a control system for improving the fidelity of an audio reproduction or communication system. One embodiment of the invention is shown in FIG. 3.

Actuator (7), which may be a loudspeaker, is mounted in a housing. The housing defines a 'back cavity' which prevents sound from the rear of the loudspeaker interfering with sound from the front. In the case of a headset, the housing may fit into the ear of the listener or may be held against the ear by a headband, for example. In the case of a telephone or communications device the actuator may be in a headset or a hand held device. Many headsets of this type are known.

Figure 1:
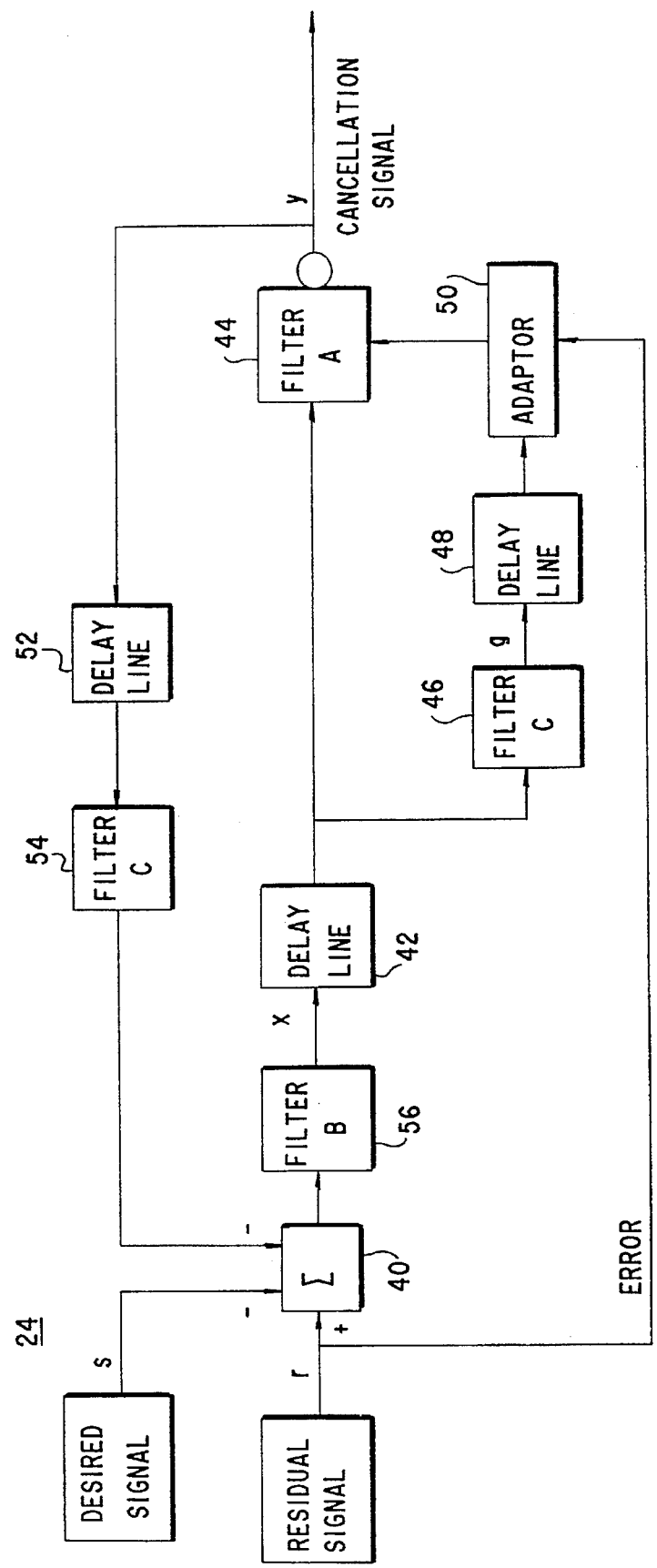
Figure 2:
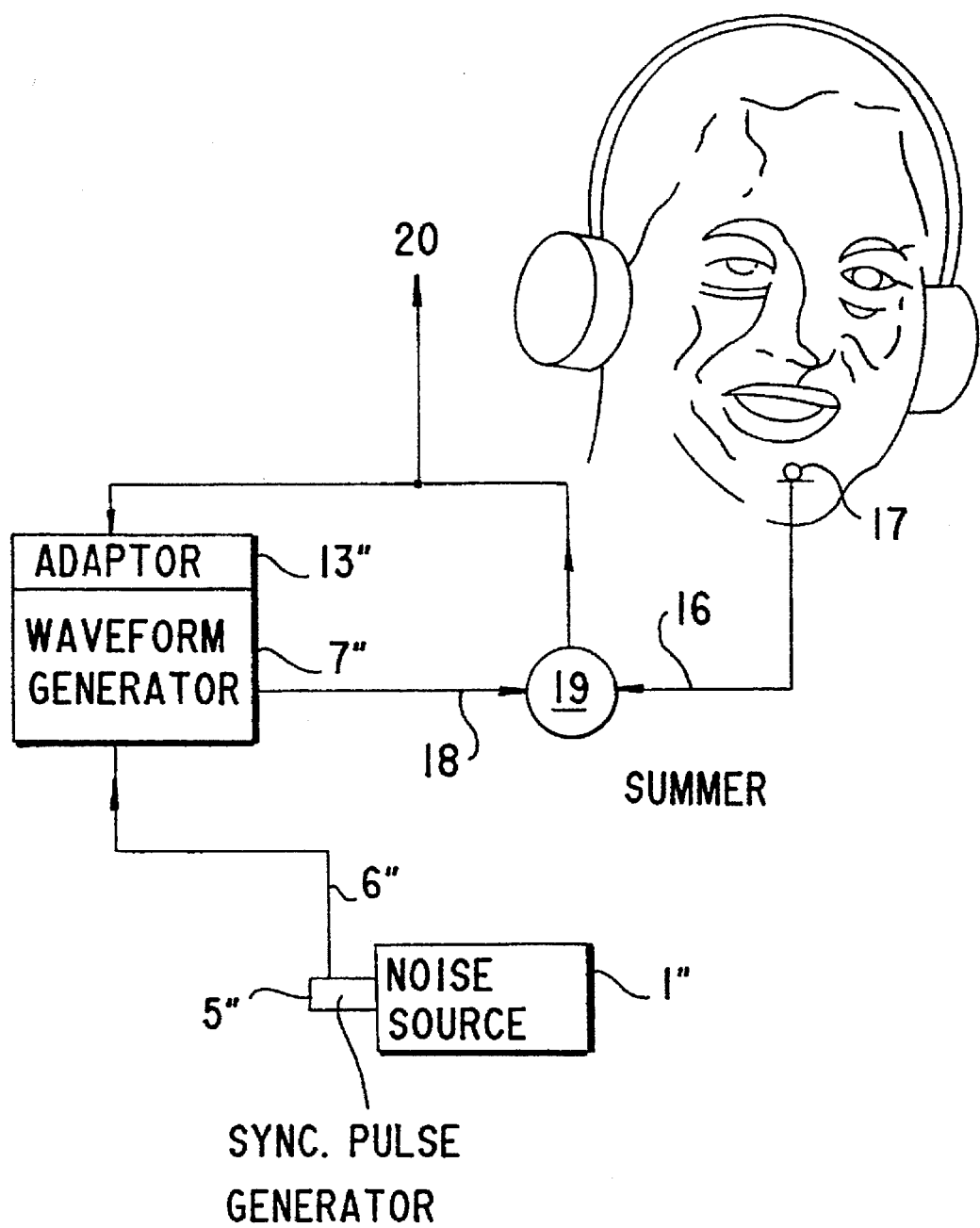
Figure 3:
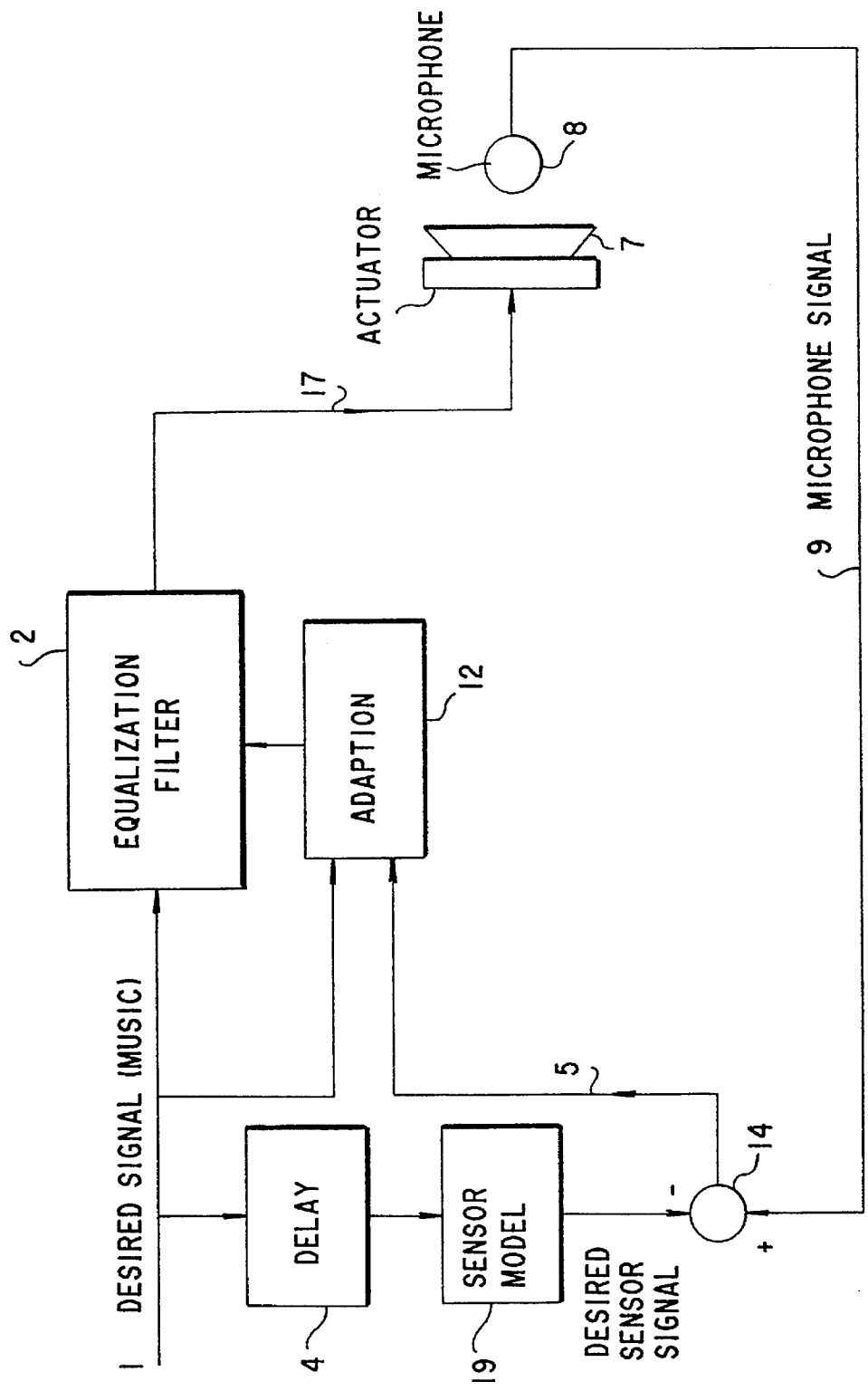

The system in FIG. 3 has at least one input (1) for receiving a desired signal such as speech or music and has at least one sensor (8) which provides a sensor signal (9) related to the sound at the ear of the listener. The desired signal is usually externally generated or is obtained by filtering an externally generated signal. The filtering may be required because the actuator will have poor performance at very low frequencies and at very high frequencies, and it may be desirable to limit the frequency content of the desired signals at these frequencies.

The sensor should ideally have a flat frequency response (it is much easier to produce a microphone with a flat response than it is to produce a speaker with a flat response) otherwise it may be necessary to compensate for its response. The sensor can be placed between the loudspeaker and the ear, attached to the loudspeaker housing, for example, or it can be at a remote location connected by an acoustic duct or tube, or it can be at a fixed position on a seat or headrest, for example.

The desired signal may be in digital or analog form. The desired signal is passed through an equalization filter (2) to produce a modified signal (17) which is used to drive the actuator (7). The sound produced by the actuator is measured by the signal sensor (8) which causes a sensor signal (9). Ideally this signal should be the same as the desired signal apart from a delay and modification by the sensor response.

A misadjustment signal (5), which is representative of the deviation of the system from the ideal response, is obtained by delaying the desired signal (4), passing it through a filter (19) which has the same response as the sensor and then subtracting it at (14) from the sensor signal. Optionally, the sensor signal can be passed through a prediction filter (20) which models the relationship between the signal at the sensor and the sound at the listener's ear. The order of the first two steps may by reversed since they are linear operations. The filter (19) may be omitted if the response of the sensor is sufficiently flat. The misadjustment signal (5) and the desired signal (1) are used to determine any required change to the equalization filter (2).

The system automatically adjusts to cope with the variability in the acoustics of the headset and automatically adjusts for the characteristics of the loudspeakers, that is, the system is self equalizing. This means that cheaper loudspeakers can be used and better fidelity can be achieved. In addition, the fidelity of the headset will not be dependent on the wearer. Currently, closed back headsets are preferred since they provide a more consistent acoustic environment, but with a self equalizing headset good fidelity can be achieved even with an open-backed headset (which is more comfortable).

The adaptive equalization filter can be implemented in digital or analog form. In the digital form the modified signal (17) is passed to a Digital to Analog Converter (DAC) then to an anti-imaging filter and an amplifier to produce a drive signal which is sent to the loudspeaker (7). The delay element (4) can be a digital delay or an analog delay. If the desired signal is in a digital form, then the sensor signal (9) may be passed through an anti-aliasing filter and then sampled using a Analog to Digital Converter (ADC). If the desired signal is in analog form, then the misadjustment signal (5) may be produced by an analog circuit before being sampled by an ADC. Alternatively, both the desired signal and the sensor signal may be sampled and the misadjustment signal calculated from the digital signals.

There are a variety of techniques for adapting digital filters. Some of these are described in B. Widrow and S. D. Stearns, 'Adaptive Signal Processing', Prentice Hall, (1985). An example is the LMS algorithm which seeks to minimize the Least Mean Square of the misadjustment signal. There are also known techniques for adjusting analog filters, some of which are described in K. J. Astrom and B. Wittenmark, 'Adaptive Control', Addison Wesley, (1989). There are also known techniques for adjusting the filter characteristics in the frequency domain.

The known adaption techniques provide methods, such as coefficient leakage or applying a frequency weighting to the misadjustment signal, for limiting the gain of the equalization filter. These methods are likely to be required, especially if fixed point digital processing is used.

Non-linearity in the loudspeaker can be another cause of loss in fidelity in a headphone system. The equalization filter must then also be non-linear. In this case an adaptive neural network can be used (see A. Lapedes and R. Farber, 'How Neural Nets Work', Proceedings of IEEE, Denver Conference on Neural Networks, 1987 for example). Such networks are known to be helpful in compensating for non-linearities of actuators.

Figure 4:
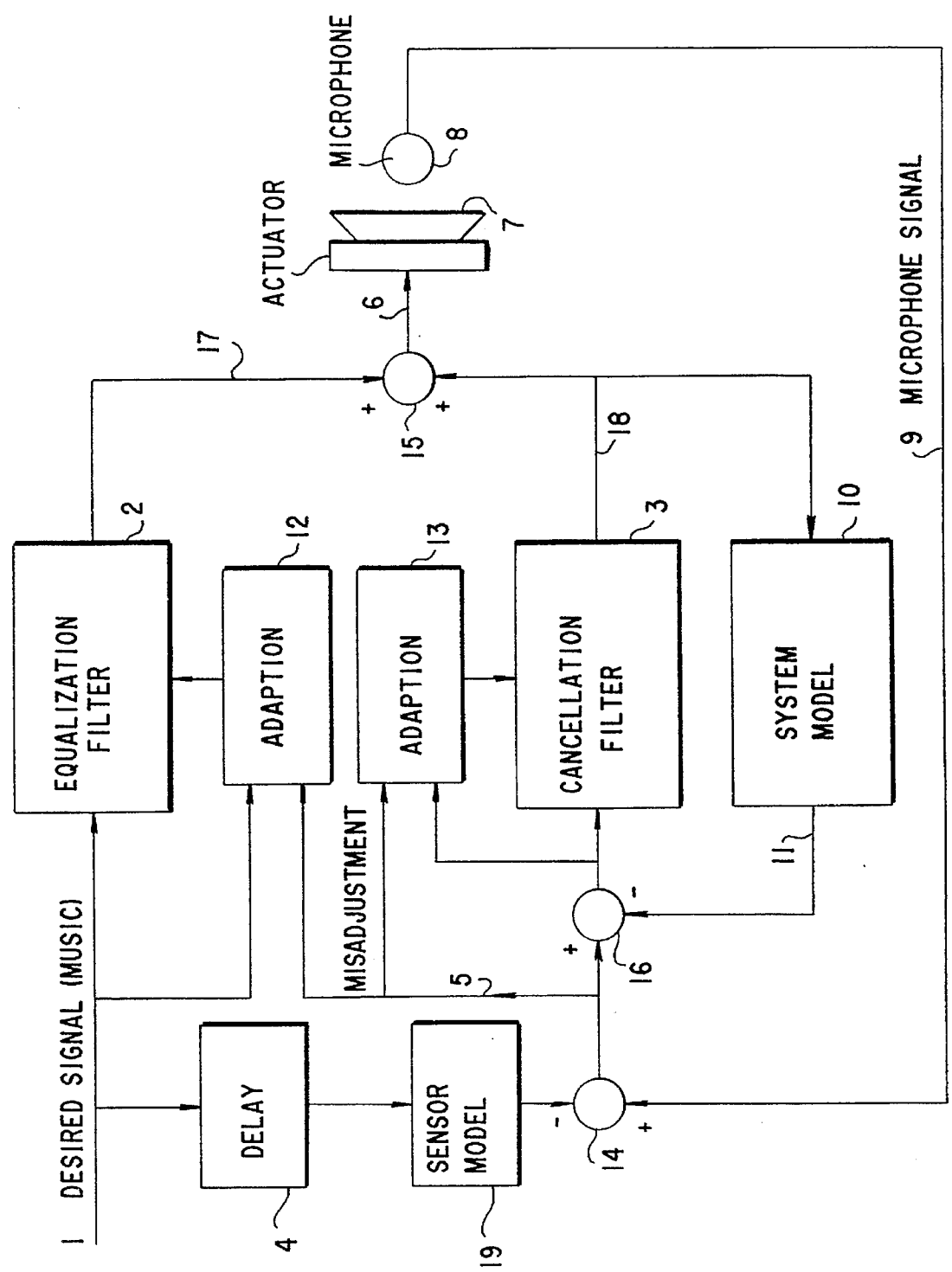

In another embodiment of the invention the adaptive equalization system is combined with an active control system. An example is shown in FIG. 4. When the equalization filter is correctly adjusted the misadjustment signal is dominated by the component of the signal due to external noise. The external noise is generally uncorrelated with the desired signal and so cannot be canceled by the modified signal (17). However, the misadjustment signal can be used as the input to a feedback active control system. The active control system may have a fixed characteristic or may be an adaptive filter as shown in FIG. 4. The adaptive filter may be of the type described in U.S. Pat. No. 5,105,377 (Ziegler) for example. The output (18) from the cancellation filter (3) is combined with the modified signal (17) from the equalization filter and passed to the loudspeaker. The predicted effect of the cancellation signal is obtained by passing the cancellation signal (18) through a model (10) of the headset response to obtain a compensation signal (11). This is then subtracted at (16) from the misadjustment signal (5) to obtain an estimate of the external noise. This estimate is then passed through the cancellation filter (3) to produce the cancellation signal (18). Other forms of feedback controllers can be used in which there is no explicit compensation for the effect of the cancellation signal.

The misadjustment signal contains any uncanceled external noise. This signal, together with the input to the cancellation filter, is used in the adaption module (13) to adjust the characteristics of the cancellation filter. Again, a variety of known adaptive filtering techniques, such as the Filtered-x LMS algorithm described in B. Widrow and S. D. Stearns, 'Adaptive Signal Processing', Prentice Hall, (1985) can be used for this adjustment.

In some embodiments there may be a requirement for the identification of the headset response for use in the compensation filter (10). There are standard System Identification techniques which can be used to give an initial estimate of the system model, which can be updated 'on-line' if required.

An alternative approach is to combine the cancellation signal (18) with the input to the equalization filter rather than the output. The active control system then sees a system whose response is approximately a pure delay, and the system identification is no longer required. A related method for controlling noise in ducts is disclosed in U.S. Pat. No. 4,473,906 (Warnaka). Noise propagation in ducts is often approximated by a pure delay and this patent discloses how a single channel LMS algorithm can be modified for active noise control in ducts.

Figure 5:
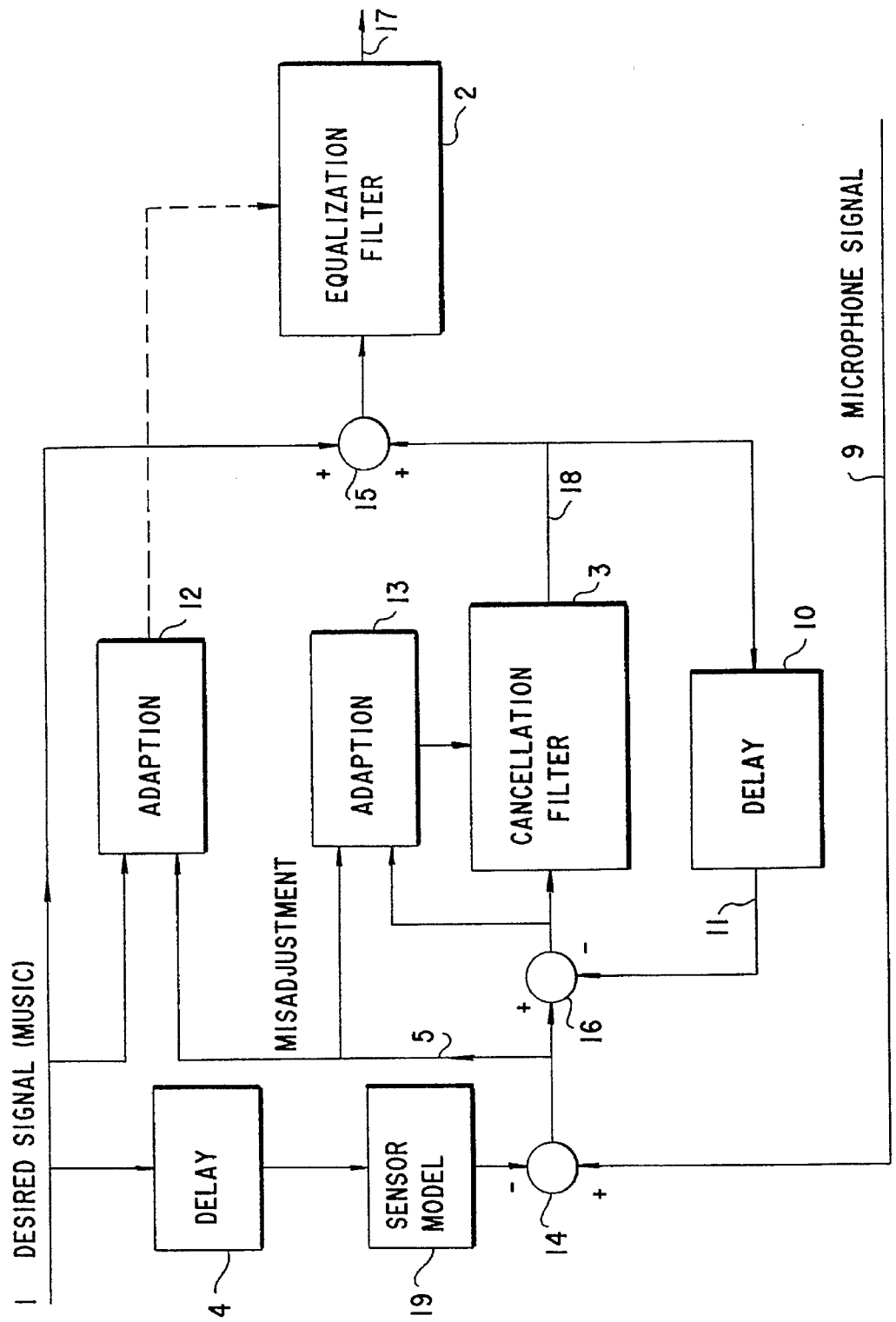

One embodiment of the approach of the current invention is shown in FIG. 5. The noise cancellation signal (18) is combined at (15) with the input (1) to the equalization filter (2). The output (17) from the equalization filter is passed to the actuator. This output signal contains both the noise cancellation signal and the desired signal.

As before, the equalization filter is adjusted in response to the desired signal (1) and the misadjustment signal (5).

This approach provides a way of implementing an active control system without the need for explicit system identification. In effect, the desired signal replaces the random or pseudo-random test signal often used in system identification techniques. This is a particular advantage for application of active noise control to headsets or telephones, where a test signal is undesirable.

The system may be implemented in digital or analog form or as a combination of both digital and analog components. The system may be configured as an independent unit to which the desired signals and the headset are connected, or it may be built into the headset itself, or it may be built into the device which generates the desired signal. Example devices are signal amplifiers, portable radios, portable cassette or compact disc players.

The invention is particularly useful for use with portable systems since they are often used in noisy environments and often use light-weight headsets.

Another application is for use with noise canceling headsets used in Magnetic Resonance Imaging (MRI) scanners (Canadian Patent No. 611,674, Friedlander). Here the acoustic response is poor because the sound is sent to the patient down long air-filled tubes and there is a very high level of external noise due the vibration of the magnets in the scanner.

The system is not limited to headsets. For example, another application is with a SilentSeat® or headrest. The SilentSeat®, described in U.S. Pat. No. 4,977,600 (Ziegler) is an active noise control system in which the actuators and sensors are built into the headrest or other part of a seat. It is very similar to a headset, the only difference being that the actuators and sensors are attached to the seat rather than to a headband or ear piece. The SilentSeat® is often used in vehicle or aircraft cabins which have a reverberant response and a high level of external noise. The system of this invention can be configured with the sensors mounted on the seat or headrest and the actuators either attached to the seat or headrest or at some remote location. An audio entertainment system or a communications system can be combined with a noise control system and the system of this invention to provide a quieter listening environment and better sound fidelity. With a SilentSeat® it is desirable to have the microphones fixed into the headrest of the seat. This may not be sufficiently close to the ear positions at high frequencies. However, the relationship between the sound at fixed ear positions and the sound at the microphones can be predicted or measured, as in patent application no. PCT/GB91/01849 (Ross and Eatwell) so that accurate equalization is still achieved. This same approach can be used even if the actuators are not attached to the seats, provided that the relative positions of the actuators and sensors remains fixed.

A still further application is in a quiet booth, such as a telephone booth or an industrial workstation. These booths often consist of partial enclosures which attempt to reduce the level of external noise. Here, the sensors can be attached to the walls of the booth, or to the telephone. The actuators may be attached to the walls of the booth, for example or the telephone actuator may be used. The system of this invention can both reduce the background noise and improve the quality of the audio signals.

The system can be extended to multiple channels using known adaptive filtering techniques (see S. J. Elliott et al, *IEEE Transactions on Acoustics, Speech and Signal Processing*, ASSP-35, 1423–1434, (1985) for example).

Figure 6:
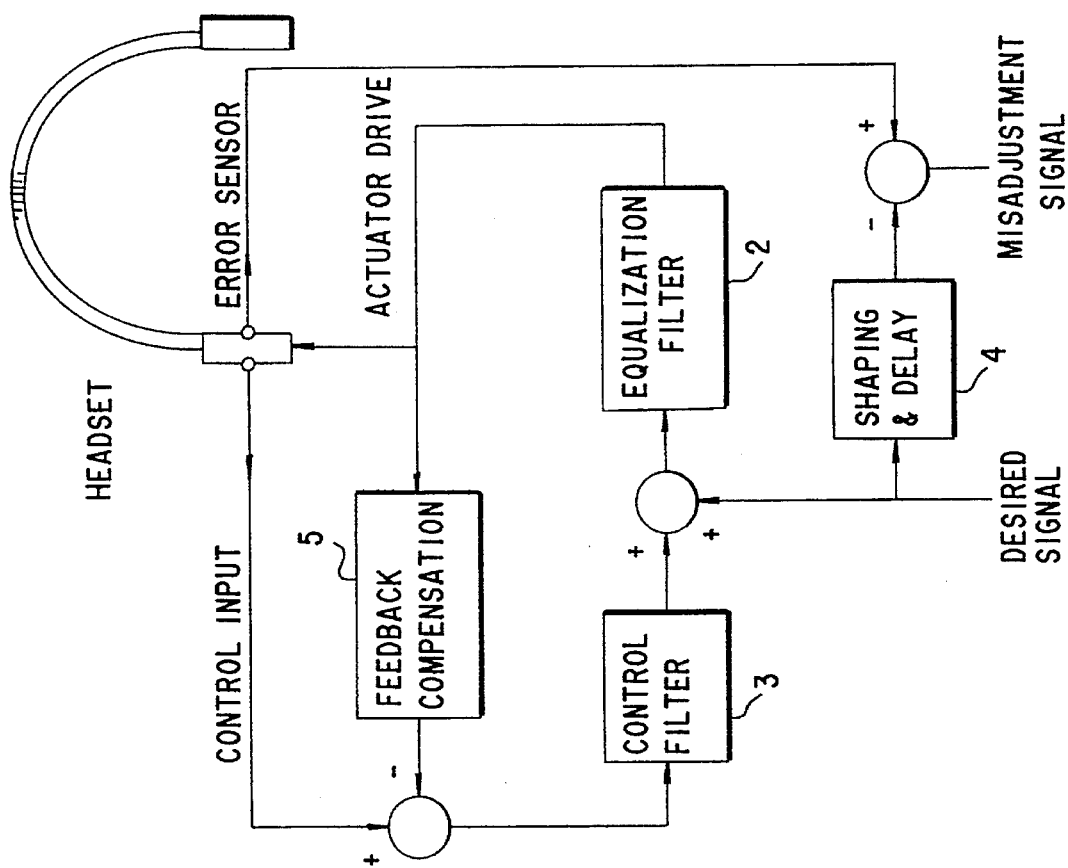

The self equalizing headset combined with a feedforward active control system is shown in FIG. 6. There would be one system for each channel (i.e. two for a stereo headset). The desired signal is combined with the output from the control filter (3) to provide the input to the equalization filter (2). The output from the equalization filter provides the actuator drive. A microphone (error sensor) on the headset detects the sound close to the ear channel and produces an input signal. As in previous embodiments, a misadjustment signal is obtained from the difference between the input signal and a modified version of the desired signal. This modification is achieved by delaying and filtering the desired signal at (4). The input to the control filter is an estimate of the external noise at a microphone on the outside of the headset (i.e. the loudspeaker is between this microphone and the ear). If required, the effect of the loudspeaker on this signal can be compensated for by passing the actuator drive signal through a compensation filter (5) and subtracting it from the control input signal. The compensation filter is a model of the physical response of the headset and external microphone. This filter can be identified using the desired signal as test signal or by using another test signal or it can be fixed by pre-calibration. The misadjustment signal is used to adjust the characteristics of the control filter and the equalization filter. Since the system response seen by the control filter approximates to a pure delay, significant simplifications to the control filter update equation are achieved.

Figure 7:
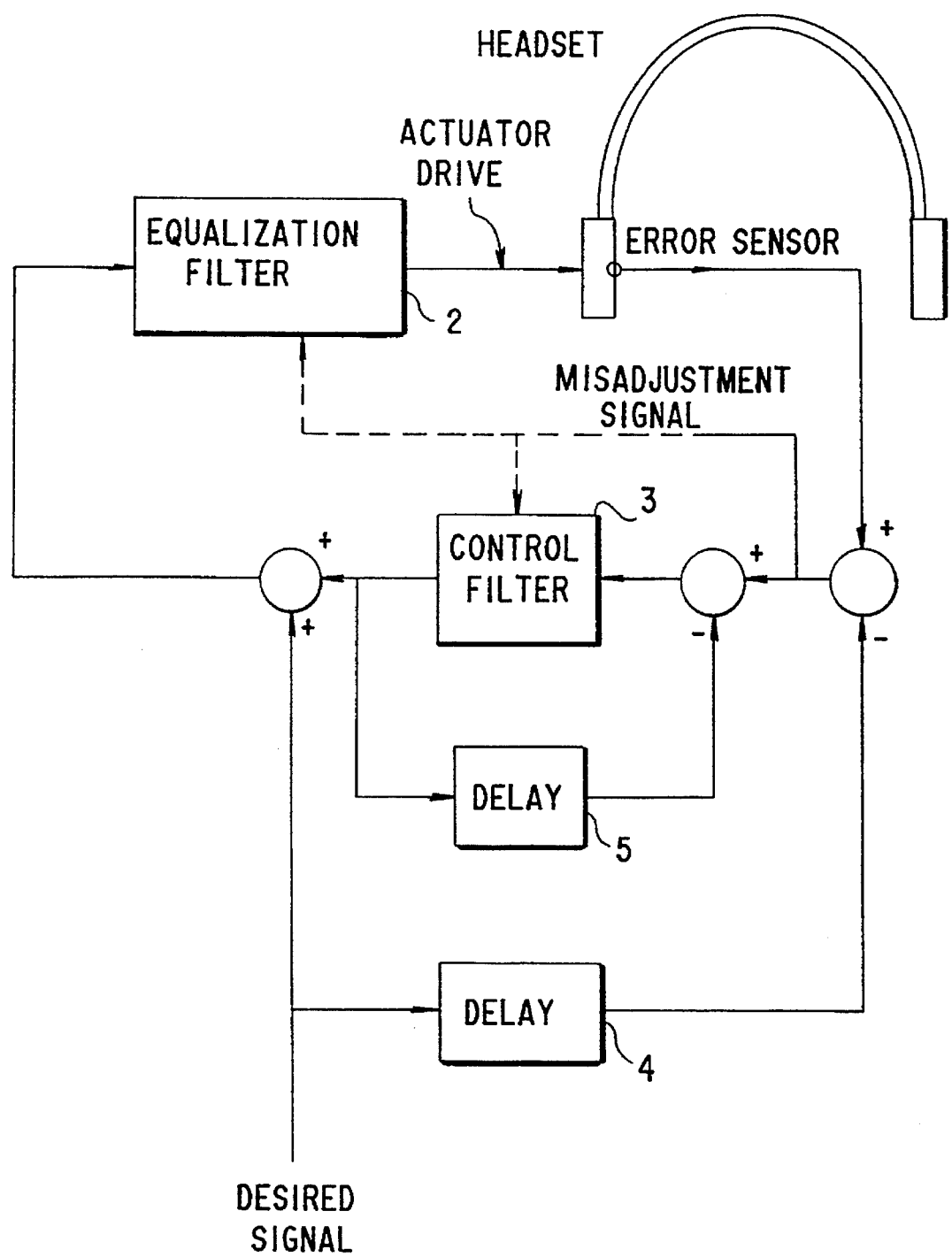

The self equalizing headset combined with a feedback active control system is shown in FIG. 7. There would be one system for each channel. The system is much the same as the feedforward system except that the misadjustment sensor signal is used as the control input. Since the equalization filter is in series with the cancellation or control filter the feedback compensation filter can be approximated by a pure delay (5) which is equal to the known modeling delay (4), so there is no requirement for system identification. This arrangement is simpler than that disclosed in U.S. Pat. No. 5,105,377 (Ziegler), since no system identification is required, and it has the advantage that equalization is incorporated for very little additional processing.

A system for a telephone could use the same structure as that shown in FIG. 7.

Other arrangements of the equalization filter and the control filter are possible, and the choice of any particular arrangement will depend upon the application but will be obvious to those of ordinary skill in the art without departing from the scope of the appended claims.

We claim:

1. A self-equalizing audio headset system, said system comprising input means for receiving a desired signal, sensor means adapted to provide a sensing signal related to the sound at the listener's ear, equalization filter means adapted to respond to said desired signal and produce a modified signal, acoustic actuator means adapted to respond to a drive signal derived from said modified signal, weighting filter means adapted to provide a model of the response of said sensor means, and delay means, said system characterized in that said equalization filter means is continuously adapted to maintain said sensing signal close to a desired sensor signal obtained by passing said desired signal through said weighting filter means and said delay means, said desired sensor signal thereby corresponding to a delayed and filtered version of said desired signal enabling the system to produce the desired sound at the listener's ear.

2. A self-equalizing audio headset system as in claim 1 in which the said delay is greater than or equal to the physical delay of the system.

3. A self-equalizing audio headset system as in claim 1 in which a misadjustment signal, which is the difference between the sensing signal and the desired sensor signal, is used to adapt characteristics of the equalization filter.

4. A self-equalizing audio headset system as in claim 3 wherein the adaption process is configured to minimize the mean square of the misadjustment signal.

5. A self-equalizing audio headset system as in claim 1 in which the equalization filter has a non-linear characteristic.

6. A self-equalizing audio headset system as in claim 1 which is combined with an active noise control means for reducing external noise entering the ear.

7. A self-equalizing audio headset system as in claim 6 in which the input to the active noise control system is the misadjustment signal.

8. A self-equalizing audio headset system as in claim 6 in which the output from the active noise control system is combined with the output from the equalization filter.

9. A self-equalizing audio headset system as in claim 6 in which the output from the active noise control system is combined with the input to the equalization filter.

10. An active noise reducing headset or communications ear-piece system, said system comprising input means adapted to receive a desired signal, sensor means adapted to provide a sensor signal related to the sound aa listener's ear, equalization filter means responsive to said desired signal and adapted to produce a first signal, signal generator means adapted to produce a cancellation signal, acoustic actuator means responsive to a signal derived from a combination of said first signal and said cancellation signal, characterized in that said signal generator means is continuously adjusted in response to said desired signal and said sensor signal.

11. An active noise reducing headset or communication ear-piece as in claim 10 in which the signal generator is responsive to an additional input from a sensor which is responsive to the external noise or some characteristic of the source of the noise.

12. An active noise reducing headset or communications ear-piece system, said system comprising sensor means adapted to provide a sensing signal related to the sound at the listener's ear, input means adapted to receive a desired signal, control filter means adapted to produce a cancellation signal responsive to a signal derived from said sensing signal, equalization filter means responsive to a combination of the cancellation signal and desired signal and adapted to produce a modified signal, means to process said desired signal to produce a desired equalization signal representing a desired equalization of said sensing signal, and acoustic actuator means responsive to a signal derived from said modified signal.

13. A system as in claim 12 wherein said sensing signal and desired sensing signal are combined to produce a misadjustment signal adapted to adjust both said equalization filter means and said control filter means.

14. A system as in claim 13 wherein the input signal to said control filter means is the difference between said cancellation signal and a delayed version of said cancellation signal.

15. A system as in claim 13 including a second sensing means adapted to produce a reference signal to be combined with a signal derived from said modified signal to produce an input signal for said control filter means.

16. A combined equalization and active noise control system comprising input means for receiving a desired input signal, sensor means adapted to provide a sensing signal related to the sound adjacent a listener's ear, equalization filter means adapted to produce a modified signal, acoustic actuator means placed adjacent to said sensor means and adapted to respond to a drive signal derived from said modified signal, and active noise control means for reducing external noise entering the ear, said system being characterized in that the active noise control means has an output which is combined with said desired signal to produce the signal inputted to said equalization filter means, said system characterized in that said equalization filter means is adjusted continuously to maintain said sensing signal close to a desired sensor signal derived from said desired input signal.

17. A system as in claim 16 in which said desired sensor signal is obtained by passing said desired input signal through a delay means.

18. A system as in claim 17 in which said delay means has a delay greater than or equal to the delay of the physical system.

19. A system as in claim 16 in which said desired sensor signal is derived from said desired input signal by filtering through a filter that includes a model of the response of said sensor means.

20. A system as in claim 16 in which the equalization filter means is adjusted in response to a misadjustment signal, which is the difference between said sensing signal and said desired sensor signal.

* * * * *